(12) United States Patent
Pontefract et al.

(10) Patent No.: US 11,796,575 B2
(45) Date of Patent: Oct. 24, 2023

(54) POWER CALCULATION APPARATUS AND POWER CALCULATION METHOD

(71) Applicant: Honda Motor Co., Ltd., Tokyo (JP)

(72) Inventors: Thomas Stephen Pontefract, Wako (JP); Hiroyuki Kanazawa, Wako (JP); Jun Kudo, Wako (JP); Ayano Otogasako, Wako (JP); Takayuki Sakurai, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 164 days.

(21) Appl. No.: 17/211,282

(22) Filed: Mar. 24, 2021

(65) Prior Publication Data

US 2021/0302480 A1 Sep. 30, 2021

(30) Foreign Application Priority Data

Mar. 27, 2020 (JP) ................. 2020-058020

(51) Int. Cl.
*G01R 21/133* (2006.01)
*G01R 31/385* (2019.01)
(Continued)

(52) U.S. Cl.
CPC ............ *G01R 21/133* (2013.01); *B60L 53/62* (2019.02); *B60L 58/12* (2019.02); *G01R 31/007* (2013.01);
(Continued)

(58) Field of Classification Search
CPC .. G01R 21/133; G01R 31/007; G01R 31/367; G01R 31/385; G01R 21/06; B60L 53/62;
(Continued)

(56) References Cited

U.S. PATENT DOCUMENTS

2008/0040296 A1 2/2008 Bridges et al.
2017/0005515 A1* 1/2017 Sanders ................. H02J 3/381
(Continued)

FOREIGN PATENT DOCUMENTS

WO 2015019585 A1 2/2015

OTHER PUBLICATIONS

European Search Report; Application EP21164603; dated Jul. 26, 2021.
(Continued)

*Primary Examiner* — Catherine T. Rastovski
*Assistant Examiner* — Yossef Korang-Beheshti
(74) *Attorney, Agent, or Firm* — Duft & Bornsen, PC

(57) ABSTRACT

A power calculation apparatus includes a microprocessor and a memory. The microprocessor is configured to perform: acquiring a power amount information regarding amounts of power input to and output from a plurality of vehicles, the amounts of power being detected by a plurality of measuring instruments provided in the plurality of vehicles or interposed between a power grid and the plurality of vehicles; classifying the plurality of measuring instruments based on errors possessed by the plurality of measuring instruments to set a plurality of groups; and calculating a total power input and output in each of the groups, based on the power amount information. The setting the plurality of groups includes setting the plurality of groups such that a mean value of errors of amounts of power in the groups is a predetermined value or less.

5 Claims, 3 Drawing Sheets

(51) Int. Cl.
  *G01R 31/367* (2019.01)
  *B60L 53/62* (2019.01)
  *B60L 58/12* (2019.01)
  *H02J 3/32* (2006.01)
  *G01R 3/00* (2006.01)
  *G01R 31/00* (2006.01)

(52) U.S. Cl.
  CPC ......... *G01R 31/367* (2019.01); *G01R 31/385* (2019.01); *H02J 3/322* (2020.01); *H02J 2310/48* (2020.01)

(58) Field of Classification Search
  CPC . B60L 58/12; B60L 55/00; H02J 3/322; H02J 2310/48; H02J 13/00022; H02J 7/00032; H02J 7/0013; Y02B 70/30; Y02B 90/20; Y02E 60/00; Y02T 10/70; Y02T 10/7072; Y02T 90/12; Y02T 90/14; Y02T 90/16; Y04S 10/126; Y04S 20/221; Y04S 40/124; Y04S 40/126
  See application file for complete search history.

(56) References Cited

U.S. PATENT DOCUMENTS

2017/0153737 A1* 6/2017 Chawda ................ G06F 3/0418
2019/0061535 A1* 2/2019 Bridges ................ B60L 53/305
2020/0006954 A1  1/2020 Miyata et al.

OTHER PUBLICATIONS

Oiml R et al; Accuracy Classes of Measuring Instruments; 34 Edition 1979.

* cited by examiner

POWER CALCULATION APPARATUS AND POWER CALCULATION METHOD

CROSS-REFERENCE TO RELATED APPLICATION

This application is based upon and claims the benefit of priority from Japanese Patent Application No. 2020-058020 filed on Mar. 27, 2020, the content of which is incorporated herein by reference.

BACKGROUND OF THE INVENTION

Field of the Invention

This invention relates to a power calculation apparatus and a power calculation method calculating an amount of power input and output via a power grid.

Description of the Related Art

As such an apparatus of this type, a conventionally known apparatus calculates the amount of power input to and output from factories or various facilities (for example, WO2015/019585A1). The apparatus described in WO2015/019585A1 calculates the amount of power with measuring instruments such as ammeters and voltmeters provided in factories and various facilities.

Meanwhile, in recent years, considered has been allowing battery-mounted vehicles such as electric vehicles (EVs) to participate in a power transaction via a power grid. The ammeter and voltmeter included in a vehicle such as an EV, however, have lower accuracy than those provided in factories and various facilities. Thus, if the amount of power is simply calculated with the ammeter or the voltmeter similarly to the apparatus described in WO2015/019585A1, it is likely to fail in accurate calculation of the amount of power output from or input to the vehicle. The similar applies to a piece of connection equipment for connecting a vehicle to a power grid.

SUMMARY OF THE INVENTION

An aspect of the present invention is a power calculation apparatus calculating amounts of power input to and output from a plurality of vehicles each including a battery. The power calculation apparatus includes a microprocessor and a memory connected to the microprocessor. The microprocessor is configured to perform: acquiring a power amount information regarding amounts of power input to and output from the plurality of vehicles, the amounts of power being detected by a plurality of measuring instruments provided in the plurality of vehicles or interposed between a power grid and the plurality of vehicles; classifying the plurality of measuring instruments based on an error information regarding errors possessed by the plurality of measuring instruments to set a plurality of measuring instrument groups each including equal to or more than a predetermined number of measuring instruments, the errors being measured in advance; and calculating a total power input and output in each of the measuring instrument groups, based on the power amount information regarding amounts of power detected by equal to or more than the predetermined number of measuring instruments belonging to each of the measuring instrument groups. The microprocessor is configured to perform the setting the plurality of measuring instrument groups including setting the plurality of measuring instrument groups such that a mean value of errors of amounts of power detected by equal to or more than the predetermined number of measuring instruments belonging to each of the measuring instrument groups is a predetermined value or less.

Another aspect of the present invention is a power calculation method calculating amounts of power input to and output from a plurality of vehicles each including a battery. The power calculation method comprises: acquiring a power amount information regarding amounts of power input to and output from the plurality of vehicles, the amounts of power being detected by a plurality of measuring instruments provided in the plurality of vehicles or interposed between a power grid and the plurality of vehicles; classifying the plurality of measuring instruments based on an error information regarding errors possessed by the plurality of measuring instruments to set a plurality of measuring instrument groups each including equal to or more than a predetermined number of measuring instruments, the errors being measured in advance; and calculating a total power input and output in each of the measuring instrument groups, based on the power amount information regarding amounts of power detected by equal to or more than the predetermined number of measuring instruments belonging to each of the measuring instrument groups. The setting the plurality of measuring instrument groups includes setting the plurality of measuring instrument groups such that a mean value of errors of amounts of power detected by equal to or more than the predetermined number of measuring instruments belonging to each of the measuring instrument groups is a predetermined value or less.

BRIEF DESCRIPTION OF THE DRAWINGS

The objects, features, and advantages of the present invention will become clearer from the following description of embodiments in relation to the attached drawings, in which.

DETAILED DESCRIPTION OF THE INVENTION

An embodiment of the present invention will be described below with reference to FIGS. 1 to 4. A power calculation apparatus according to the embodiment of the present invention is provided between a vehicle such as an electric vehicle (EV) and a power grid, and calculates power for transfer between a battery mounted on the vehicle and the power grid. Hereinafter, the power grid may be simply referred to as a grid. In addition, in the following, when simply expressed as a vehicle, the vehicle means an EV.

Recently, the effective utilization of renewable energy has been promoted due to the increase in greenhouse gas emissions. As one of the effective utilization, a Vehicle to Grid (V2G) system has been proposed, in which EVs are connected to a power grid and the energy stored in the batteries mounted on the EVs is utilized effectively.

In such a V2G system, the EVs not only receive power supply from the grid to charge the batteries, but also supply the power stored in the batteries to the grid, resulting in making the batteries function as if the batteries were one of the power storage facilities in a commercial power grid. As described above, in the V2G system, not only one-way power supply from the power grid to the EVs, but also two-way power transfer including power supply from the EVs to the power grid are performed.

Figure 1:
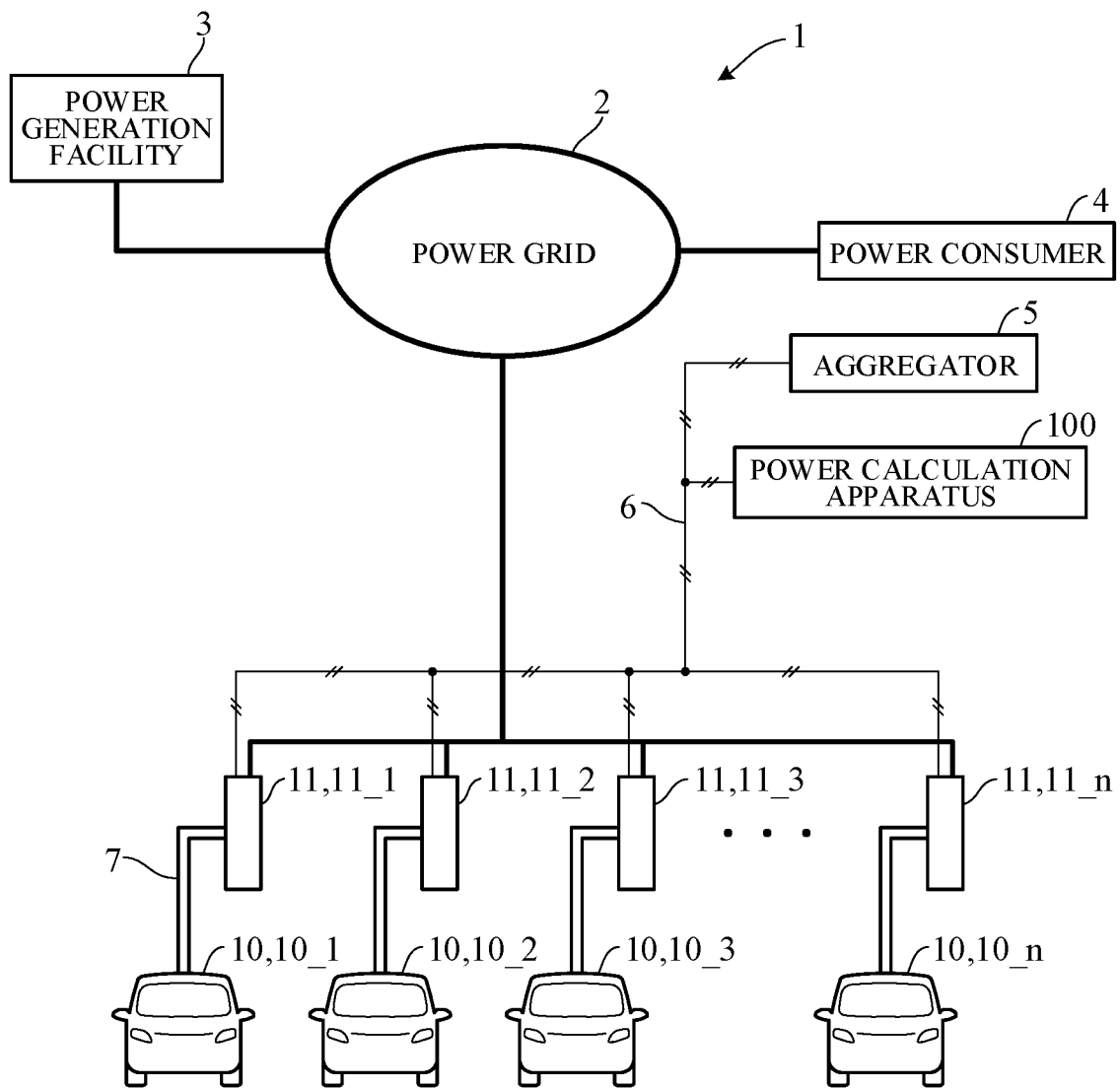
FIG. 1 is a diagram schematically showing a power system to which a power calculation apparatus according to an embodiment of the present invention is applied.

FIG. 1 schematically illustrates a power system including the V2G system to which the power calculation apparatus according to the present embodiment is applied. As illustrated in FIG. 1, a power system 1 to which a power calculation apparatus 100 is applied includes a power grid 2, a power generation facility 3 for supplying generated power to the power grid 2, and a power consumer 4 such as factories or various facilities supplied with power from the power grid 2.

The power system 1 also includes EVs 10_1 to 10_n that each transfer power between the EV 10 and the power grid 2, and pieces of connection equipment (electric vehicle supply equipment as abbreviated to EVSE) 11_1 to 11_n each interposed between the power grid 2 and the corresponding EV 10. The power system 1 further includes a server device (hereinafter, referred to as an aggregator) 5 for centrally managing power for input and output between the power grid 2 and each EV 10.

The power calculation apparatus 100 is disposed between the pieces of EVSE 11 and the aggregator 5. As illustrated in FIG. 1, the power calculation apparatus 100, each piece of EVSE 11, and the aggregator 5 are connected via a wired or wireless communication network 6 and are communicable with each other.

Each piece of EVSE 11 and the corresponding EV 10 can be connected by a charging cable 7. Each piece of EVSE 11 and the corresponding EV 10 are capable of power transfer therebetween via the charging cable 7. In the present embodiment, each piece of EVSE 11 supplies power supplied from the power grid 2 to the corresponding EV 10 to charge the battery mounted on the EV 10. Each piece of EVSE 11 also supplies power from the corresponding EV 10 to the power grid 2 to make the battery mounted on the EV 10 function as one of the power storage facilities in the power grid 2.

In response to reception of a power adjustment request from the electric power company managing the power generation facility 3, the aggregator 5 causes the battery mounted on each EV to charge and discharge, based on the amount of surplus power or the amount of shortage power between the power generation facility 3 and the power consumer 4, and adjusts the supply-and-demand balance of the entire power system 1. The aggregator 5 is in connection with the electric power company managing the power generation facility 3 by a communication network (not illustrated). The aggregator 5 receives the power adjustment request from the electric power company and acquires information related to the amount of surplus power or the amount of shortage power via the communication network.

For example, in a case where the amount of power supply of the power generation facility 3 is shortage for the amount of power demand of the power consumer 4, the aggregator 5 causes the batteries of EVs 10 to discharge such that the EVs 10 compensate for the amount of shortage power. Specifically, the aggregator 5 transmits a command for causing the battery of each EV 10 to discharge, to the corresponding piece of EVSE 11. Each piece of EVSE 11 having received this command causes the battery of the corresponding EV 10 to discharge, so that the power from each battery is supplied to the power grid 2.

As described above, the aggregator 5 adjusts the amount of power for transfer between the power grid 2 and each EV 10 so as to maintain the supply-and-demand balance in the power system 1.

Note that a plurality of aggregators may be present in the power system 1; however, for the sake of simplicity, it is assumed in the present embodiment that one aggregator 5 performs control such that the supply-and-demand balance of the entire power system 1 is maintained. The power system 1 may also include a plurality of power generation facilities and a plurality of power consumers.

Meanwhile, in order for the aggregator 5 to perform such control of the supply-and-demand balance as above, it needs to grasp accurately, that is, with predetermined accuracy, the amount of power input and output between the power grid 2 and each EV (hereinafter, referred to as the amount of EV input-and-output power).

The measuring instruments such as an ammeter and a voltmeter mounted on each EV 10, however, are inexpensive and simple, and thus are difficult to detect the amount of power with the accuracy required by the aggregator 5. On the other hand, it is conceivable to mount, on each EV 10, a measuring instrument satisfying the accuracy required by the aggregator 5. Such a high-accuracy measuring instrument, however, is expensive and thus its implementation is difficult due to an increase in the vehicle price.

Therefore, the power calculation apparatus 100 according to the present embodiment calculates the amount of EV input-and-output power by the following method such that the amount of EV input-and-output power can be calculated with the accuracy required by the aggregator 5 by using a simple measuring instrument provided in each EV 10.

The amount of power detected from the measuring instrument provided in each EV 10 (hereinafter, referred to as the amount of detected power) typically includes a plus or minus error to the true value. Thus, it is estimated that such an error is canceled if a plurality of amounts of detected power is added together and that the error converges to zero as the number of amounts of detected power for adding together is increased. Therefore, it is considered that the total value having predetermined accuracy can be obtained by adding together equal to or more than a predetermined number of amounts of detected power.

Figure 3:
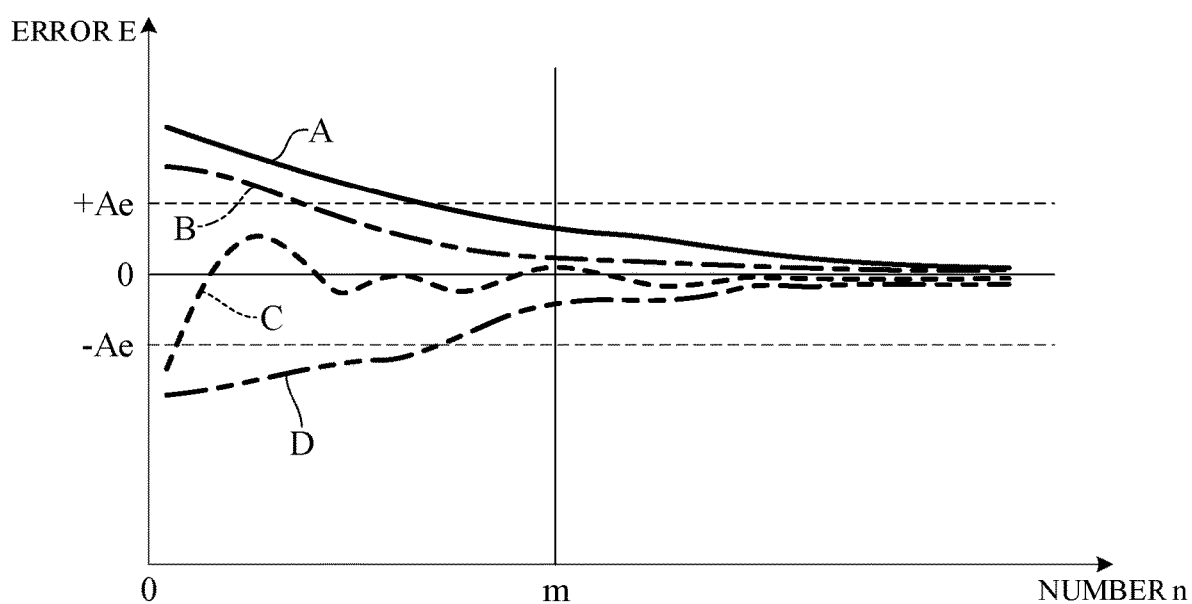
FIG. 3 is a graph conceptually showing a relationship between the number of measuring instruments when the amounts of detected power are added together and an error to a true value of a total value.

FIG. 3 is a graph conceptually illustrating the relationship between the number n when the amounts of detected power of the n number of measuring instruments are added together and the error E to the true value of the total value. The graph of FIG. 3 illustrates the relationship between the number n and the error E of each of a plurality of EV groups (groups A to D). As illustrated in FIG. 3, it is estimated that in each group, the error E converges to zero as the number n for adding together the amounts of detected power is increased.

However, in order to make the error E of the total value zero, it is necessary to add together a considerable number of amounts of detected power, and thus it is assumed that the number is much larger than that of EVs managed by the aggregator 5. Nevertheless, referring to FIG. 3, it can be seen that the error E of the total value falls within a predetermined range by adding together the amounts of detected power for a certain number.

Therefore, in the present embodiment, the power calculation apparatus 100 obtains the number m that enables the error E of the total value to fall within the error range±Ae corresponding to the accuracy required by the aggregator 5. Then, the power calculation apparatus 100 adds together the amounts of detected power of the measuring instruments one-to-one provided in the EVs, for each group of the EVs including at least the m number of EVs, and notifies the aggregator 5 of the total value as the amount of EV input-and-output power. In the present embodiment, the power calculation apparatus 100 calculates the amount of EV input-and-output power with the accuracy required by the aggregator 5, in such a manner.

A method of determining m will now be described. First, from P pieces (for example, 1000) of measuring instruments that are the number of all measuring instruments for shipment, p pieces (for example, 100) of measuring instruments are extracted as samples, and data indicating the distribution of the respective errors possessed by extracted measuring instruments, that is, the read values is derived. Here, the mean value x and the standard deviation s are derived as the data indicating the error distribution.

Assuming that the standard deviation of the errors of the population (P pieces of measuring instruments) estimated from the standard deviation s of the errors of the p pieces is σ, the average μ of the errors of the P pieces is calculated from the following Expression (i):

$$\mu = x + s/\sqrt{p} \qquad (i)$$

Then, while varying the value of p, p is searched such that μ calculated by Expression (i), that is, the mean value of the errors of the population falls within the error range±Ae corresponding to the accuracy required by the aggregator 5. Then, p obtained as the result of the search is determined to be m.

Figure 2:
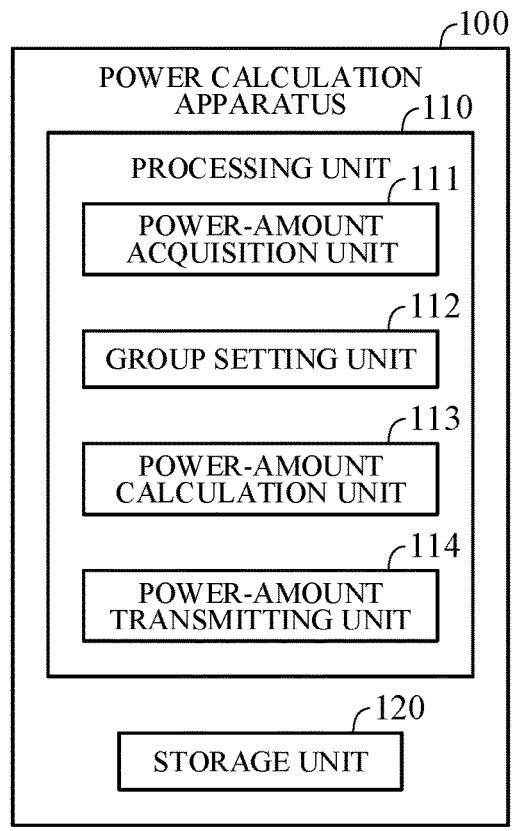
FIG. 2 is a diagram showing an exemplary functional configuration of the power calculation apparatus according to an embodiment of the present invention.

Next, the configuration of the power calculation apparatus 100 according to the present embodiment will be described. FIG. 2 is a diagram illustrating an exemplary functional configuration of the power calculation apparatus 100. As illustrated in FIG. 2, the power calculation apparatus 100 includes a processing unit 110 such as a central processing unit (CPU) (microprocessor), read only memory (ROM), random access memory (RAM), and a memory (storage unit) 120 such as a hard disk. The processing unit 110 executes a program stored in the storage unit 120 to function as a power-amount acquisition unit 111, a group setting unit 112, a power-amount calculation unit 113, and a power-amount transmitting unit 114.

The power-amount acquisition unit 111 acquires, from each EV 10, information indicating the amount of power input to and output from the EV 10 detected by the measuring instrument of the EV 10 (hereinafter, referred to as detected-power-amount information). The amount of power referred to here is the amount of achievement power per predetermined duration (for example, 30 minutes). Note that the amount of power input to and output from each EV 10 may be detected by a measuring instrument provided in the corresponding piece of EVSE 11. In this case, it is sufficient if the power-amount acquisition unit 111 acquires the detected-power-amount information from the piece of EVSE 11.

The group setting unit 112 determines a predetermined number m by the above determination method, based on information indicating the error possessed by the measuring instrument of each EV 10 (hereinafter, referred to as measuring-instrument error information or simply referred to as error information) and Expression (i). Then, the group setting unit 112 sets a plurality of groups each including equal to or more than the predetermined number m of measuring instruments, for the measuring instruments of the EVs 10_1 to 10_n. As a result, the measuring instruments of the EVs 10_1 to 10_n are classified into the plurality of groups.

Note that it is assumed that the error possessed by the measuring instrument of an EV 10 is measured in advance. Specifically, at the time of factory shipment of the measuring instruments, errors possessed by at least equal to or more than the predetermined number m of measuring instruments are measured and then the measuring-instrument error information including the measurement result is stored in advance in the storage unit 120. Note that the predetermined number m may be calculated in advance based on the measuring-instrument error information and Expression (i), and information indicating the predetermined number m may be stored in advance in the storage unit 120. In this case, it is sufficient if the group setting unit 112 performs group setting in accordance with the predetermined number m indicated by the information stored in the storage unit 120.

In a case where the amount of power input to and output from each EV 10 is detected by the measuring instrument of the EV 10, the group setting unit 112 groups each EV 10 such that the predetermined number m is larger, in comparison with a case where the amount of power input to and output from each EV 10 is detected by the measuring instrument of the corresponding piece of EVSE 11. The reason for the grouping is that the measuring instruments of pieces of EVSE 11 are each originally designed for power input and output applications, and thus are often considered to have higher accuracy than those of the EVs 10.

Note that in a case where the amount of power input to and output from each EV is detected by the measuring instrument of the corresponding piece of EVSE 11, it is sufficient if the group setting unit 112 determines the predetermined number m by the above determination method, based on the information indicating the error possessed by the measuring instrument of the piece of EVSE 11 and Expression (i). Similarly to the case of measuring the error possessed by the measuring instrument of each EV 10, it is sufficient if the error possessed by the measuring instrument of the piece of EVSE 11 is measured at the time of factory shipment of the measuring instrument.

Furthermore, the power-amount acquisition unit 111 may set whether the amount of power detected by the measuring instrument of each EV 10 is acquired or the amount of power detected by the measuring instrument of the corresponding piece of EVSE 11 is acquired, to the power calculation apparatus 100 via the communication network 6 from the aggregator 5 or an external device.

For example, via a communication interface (not illustrated) included in the power calculation apparatus 100, the aggregator 5 or the external device inputs an instruction related to the above setting, to the power-amount acquisition unit 111. Then, in response to the instructed setting details, the power-amount acquisition unit 111 acquires the amount of power detected by the measuring instrument of each EV 10 or the amount of power detected by the measuring instrument of the piece of EVSE 11. The group setting unit 112 determines the predetermined number m in accordance with the instructed setting details.

The power-amount calculation unit 113, for each group of measuring instruments set by the group setting unit 112, adds together the amount of power indicated by the detected-power-amount information acquired by the power-amount acquisition unit 111 and calculates the total amount of power input and output. Thus, the amount of EV input-and-output power of each group is calculated.

The power-amount transmitting unit 114 transmits the amount of EV input-and-output power of each group calculated by the power-amount calculation unit 113, to the aggregator 5. Thus, the amount of EV input-and-output power of each group is notified to the aggregator 5. Note that the power-amount transmitting unit 114 may notify the aggregator 5 of the amount of EV input-and-output power of the whole of the EVs 10_1 to 10_n obtained by adding together the respective amounts of EV input-and-output power of the groups.

Figure 4:
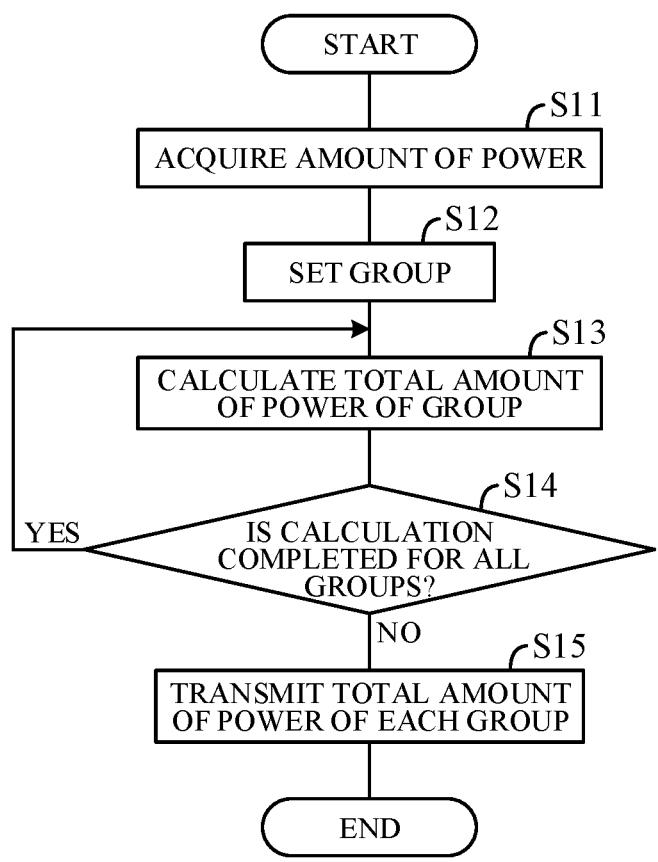
FIG. 4 is a flowchart showing an exemplary operation of the power calculation apparatus according to an embodiment of the present invention.

Next, the operation of the power calculation apparatus 100 according to the present embodiment will be described. FIG. 4 is a flowchart illustrating an exemplary operation of the power calculation apparatus 100. The processing illustrated in FIG. 4 is performed in response to a start request instruction from the aggregator 5. For example, in response to reception of the above power adjustment request from the electric power company managing the power generation facility 3, the aggregator 5 outputs an instruction for requesting to start calculating power, to the power calculation apparatus 100.

First, in Step S11, the power-amount acquisition unit 111 requests each piece of EVSE 11 to provide detected-power-amount information. In response to reception of the request from the power-amount acquisition unit 111, each piece of EVSE 11 transmits the detected-power-amount information of the EV in connection with this piece of EVSE 11, to the power calculation apparatus 100. At this time, any piece of EVSE 11 that no EV 10 is in connection therewith does not transmit any detected-power-amount information to the power calculation apparatus 100.

In the present embodiment, during connection with each piece of EVSE 11 by the charging cable 7, the corresponding EV 10 detects, with the measuring instrument, the amount of power input to and output from the power grid 2 via the EVSE 11 at a predetermined cycle. Then, every predetermined duration (for example, 30 minutes), each EV 10 transmits information indicating the amount of achievement power detected over the predetermined duration, to the corresponding piece of EVSE 11, as the detected-power-amount information. Note that it is assumed that each EV 10 is communicable with the corresponding piece of EVSE 11 by power line communication (PLC) via the charging cable 7. Each EV 10 may also be wirelessly communicable with the corresponding piece of EVSE 11.

Next, in Step S12, the group setting unit 112 determines the predetermined number m, based on the measuring-instrument error information stored in the storage unit 120 and Expression (i). Then, the group setting unit 112 classifies the measuring instruments of the EVs one-to-one in connection with the pieces of EVSE 11_1 to 11_n into a plurality of groups each including equal to or more than a predetermined number m of measuring instruments. Thus, the plurality of groups are set.

Next, in Step S13, the power-amount calculation unit 113 selects one group as the calculation target of the total amount of power, from the plurality of groups set in Step S12. At this time, the power-amount calculation unit 113 does not select a group for which the total amount of power has already been calculated. The power-amount calculation unit 113 calculates the total amount of power input and output by the selected group, that is, the amount of EV input-and-output power, based on the detected-power-amount information of all the measuring instruments belonging to the selected group.

In Step S14, the power-amount calculation unit 113 determines whether or not the amount of EV input-and-output power has been calculated for all the plurality of groups set in Step S12. In a case where the determination is negative in Step S14, the processing returns to Step S13.

In a case where the determination is positive in Step S14, in Step S15, the power-amount transmitting unit 114 transmits, to the aggregator 5, information indicating the amount of EV input-and-output power of each group calculated by the power-amount calculation unit 113. Thus, the amount of EV input-and-output power of each group is notified to the aggregator 5. Note that the power-amount transmitting unit 114 may transmit information indicating the total value of the amount of EV input-and-output power of each group, to the aggregator 5.

According to the embodiment of the present invention, the following functions and effects can be obtained.

(1) The power calculation apparatus 100 that calculates amounts of power input to and output from a plurality of vehicles each including a battery. The power calculation apparatus 100 includes: a power-amount acquisition unit 111 configured to acquire the power amount information regarding amounts of power that are amounts of power input to and output from the EVs 10_1 to 10_n, the amounts of power being detected by the plurality of measuring instruments that is provided one-to-one in the EVs 10_1 to 10_n or is each interposed between the power grid 2 and the corresponding one of the EVs 10_1 to 10_n; a group setting unit 112 configured to classify the plurality of measuring instruments based on the error information regarding errors possessed by the plurality of measuring instruments to set a plurality of measuring instrument groups each including equal to or more than the predetermined number m of measuring instruments, the errors being measured in advance; and a power-amount calculation unit 113 configured to calculate total power input and output in each of measuring instrument groups set by the group setting unit 112, based on the power amount information regarding the amounts of power detected by equal to or more than the predetermined number m of measuring instruments belonging to each of the measuring instrument groups set by the group setting unit 112, among the power amount information regarding the amounts of power acquired by the power-amount acquisition unit 111. The group setting unit 112 sets the plurality of groups such that the mean value of the errors of results of the detection by equal to or more than the predetermined number m of measuring instruments belonging to the same group is a predetermined value or less.

Thus, even in a case where the plurality of measuring instruments includes a measuring instrument that is difficult to detect the amount of power with detection accuracy required by an aggregator 5, total amount of power of the power input and output between the power grid 2 and each EV 10 can be calculated with the accuracy required by the aggregator 5. Therefore, the aggregator 5 can suitably control a supply-and-demand balance of a power system 1 even when each EV 10 is in connection with the power grid 2. As a result, the EVs is allowed to participate in a power transaction.

(2) The group setting unit 112 varies the predetermined number m between in a case where the amounts of power input to and output from the EVs 10_1 to 10_n are detected by the measuring instruments provided one-to-one in the EVs 10_1 to 10_n and in a case where the amounts of power input to and output from the EVs 10_1 to 10_n are detected by the corresponding pieces of EVSE 11_1 to 11_n.

Thus, even in a case where the measuring instrument of each EV 10 is different in accuracy from that of the measuring instrument of the corresponding piece of EVSE 11, the total amount of power of the power input and output between the power grid 2 and each EV 10 can be calculated with the accuracy required by the aggregator 5.

(3) The power calculation apparatus 100 further includes a storage unit 120 configured to store the information regarding the respective errors possessed by the measuring instruments provided one-to-one in the EVs 10_1 to 10_$n$ or the measuring instruments provided one-to-one in the pieces of EVSE 11_1 to 11_$n$, the errors being measured in advance. Then, the group setting unit 112 determines the predetermined number m, based on data indicating an error distribution obtained from the information regarding the errors stored in the storage unit 120.

Thus, the determination of the predetermined number m based on the data indicating the error distribution enables reliably calculation of the total amount of power of the power input and output between the power grid 2 and each EV 10 with the accuracy required by the aggregator 5.

(4) The group setting unit 112 varies the predetermined number m in accordance with an area where the EVs 10_1 to 10_$n$ are in connection with the power grid 2. Thus, in a case where the accuracy required by the aggregator 5 is different depending on an area managed by the aggregator 5, the predetermined number m can be determined suitably for each area. For example, the group setting unit 112 makes the predetermined number m larger as the accuracy required by the aggregator 5 is higher such that the error E of the total value of amounts of detected power is further smaller. Thus, the total amount of power of the power input and output between the power grid 2 and each EV can be calculated with the accuracy required by the aggregator 5 regardless of the area managed by the aggregator 5.

The above embodiment may be modified variously. Such modifications will be described below. There has been exemplified in the above embodiment that the power calculation apparatus 100 is disposed between the pieces of EVSE 11 and the aggregator 5; however, a power calculation apparatus may be included inside an aggregator.

In addition, there has been exemplified in the above embodiment that the power-amount calculation unit 113 calculates the amounts of EV input-and-output power of all the groups (Steps S13, S14), and then the power-amount transmitting unit 114 transmits the information indicating the amount of EV input-and-output power of each group to the aggregator 5 (Step S15). However, each time a power-amount calculation unit calculates the amount of EV input-and-output power of each group, a power-amount transmitting unit may transmit information indicating the amount of EV input-and-output power of the group to the aggregator.

In addition, there has been exemplified in the above embodiment that one aggregator 5 is provided in the power system 1. However, in a case where a plurality of aggregators is provided in the power system 1 and the aggregators manage one-to-one EV groups different from each other, a power management apparatus may be disposed between each aggregator and the corresponding EV group.

There has been further exemplified in the present embodiment that each EV 10 is in connection with the aggregator 5. An aggregator, however, may be in connection with a fixed battery fixed and provided to a house or the like, such as a battery for storing power by solar power generation. Note that in a case where both such a fixed battery and an EV are in connection with the aggregator, a power calculation apparatus calculates the power of the fixed battery and the power of the EV separately.

The above embodiment can be combined as desired with one or more of the above modifications. The modifications can also be combined with one another.

According to the present invention, the amount of power input and output via a power grid can be calculated accurately.

Above, while the present invention has been described with reference to the preferred embodiments thereof, it will be understood, by those skilled in the art, that various changes and modifications may be made thereto without departing from the scope of the appended claims.

What is claimed is:

1. A power system comprising:
an aggregator that controls a supply-and-demand balance of the power system including a power grid and a plurality of vehicles each having a battery; and
a power calculation apparatus communicable with the aggregator, the power calculation apparatus comprising:
a microprocessor and a memory connected to the microprocessor, wherein the microprocessor is configured to perform:
acquiring power amount information regarding amounts of power input to and output from the plurality of vehicles, the amounts of power detected by a plurality of measuring instruments;
classifying, based on error information regarding errors possessed by the plurality of measuring instruments, the measuring instruments into a plurality of measuring instrument groups each including at least a specified number of the measuring instruments, the errors being measured in advance, the specified number determined such that a mean value of a relative value of errors of the amounts of power detected by the measuring instruments belonging to a same measuring instrument group is a predetermined value or less;
calculating a total power input and output in each of the measuring instrument groups, based on the power amount information regarding the amounts of power detected by at least the specified number of measuring instruments belonging to each of the measuring instrument groups, and
transmitting information indicating the total power to the aggregator, wherein
the aggregator adjusts the supply-and-demand balance of the power system based on the total power by transmitting a command to the vehicles of one or more of the measuring instrument groups causing the battery mounted on each of the vehicles to discharge to the power grid, wherein
the plurality of measuring instruments is a plurality of first measuring instruments provided in the plurality of vehicles or a plurality of second measuring instruments provided in a plurality of connection equipment interposed between the power grid and the plurality of vehicles,
the microprocessor is configured to perform
the classifying including varying the specified number between a case where the plurality of measuring instruments is the plurality of first measuring instruments and a case where the plurality of measuring instruments is the plurality of second measuring instruments, wherein
the specified number in the case where the plurality of measuring instruments is the plurality of first measuring instruments is larger than the predetermined number in the case where the plurality of measuring instruments is the plurality of second measuring instruments, wherein the memory is configured to store the error information regarding the errors possessed by the first measuring instruments and the errors possessed by the second measuring instruments, the errors being measured in advance, and wherein the microprocessor is configured to perform the classifying including searching a number of the first measuring instruments such that the mean value of errors of the amounts of power detected by the first measuring instruments is equal to or less than the predetermined value to determine the number of the first measuring instruments as the first predetermined number, according to data indicating an error distribution obtained based on the error information regarding the errors possessed by the first measuring instruments stored in the memory, and searching a number of the second measuring instruments such that the mean value of errors of the amounts of power detected by the second measuring instruments is equal to or less than the predetermined value to determine the number of the second measuring instruments as the second predetermined number, according to data indicating an error distribution obtained based on the error information regarding the errors possessed by the second measuring instruments stored in the memory.

2. The power system according to claim 1, wherein
the power calculation apparatus further comprises a communication interface, and
the microprocessor is configured to perform
the acquiring including acquiring first power amount information regarding the amounts of power detected by the plurality of first measuring instruments transmitted from the plurality of vehicles or second power information regarding the amounts of power detected by the plurality of second measuring instruments transmitted from the plurality of connection equipment, via the communication interface according to a setting for determining whether the first power amount information or the second power amount information is acquired when an instruction regarding the setting is input via the communication interface.

3. The power system according to claim 1, wherein
the microprocessor is configured to perform
the classifying including varying the specified number according to an area where the plurality of vehicles are in connection with the power grid.

4. A power calculation method of a power calculation apparatus communicable with the aggregator, the aggregator controls a supply-and-demand balance of a power system including a power grid and a plurality of vehicles each having a battery, the power calculation method comprising:
acquiring power amount information regarding amounts of power input to and output from the plurality of vehicles, the amounts of power detected by a plurality of measuring instruments;
classifying, based on error information regarding errors possessed by the plurality of measuring instruments, the measuring instruments into a plurality of measuring instrument groups each including at least a specified number of measuring instruments, the errors being measured in advance, the specified number determined such that a mean value of relative value of errors of the amounts of power detected by the measuring instruments belonging to a same measuring instrument group is a predetermined value or less;
calculating a total power input and output in each of the measuring instrument groups, based on the power amount information regarding the amounts of power detected by at least the specified number of measuring instruments belonging to each of the measuring instrument groups, and
transmitting information indicating the total power to the aggregator, wherein
the aggregator adjusts the supply-and-demand balance of the power system based on the total power by transmitting a command to the vehicles of one or more of the measuring instrument groups causing the battery mounted on each of the vehicles to discharge to the power grid, wherein
the plurality of measuring instruments is a plurality of first measuring instruments provided in the plurality of vehicles or a plurality of second measuring instruments provided in a plurality of connection equipment interposed between a power grid and the plurality of vehicles,
the specified number in a case where the plurality of measuring instruments is the plurality of first measuring instruments is larger than the specified number in a case where the plurality of measuring instruments is the plurality of second measuring instrument,
the error information includes the error information regarding the errors possessed by the first measuring instruments and the errors possessed by the second measuring instruments, the errors being measured in advance, and
the classifying includes searching a number of the first measuring instruments such that the mean value of errors of the amounts of power detected by the first measuring instruments is equal to or less than the predetermined value to determine the number of the first measuring instruments as the first specified number, according to data indicating an error distribution obtained based on the error information regarding the errors possessed by the first measuring instruments, and searching a number of the second measuring instruments such that the mean value of errors of the amounts of power detected by the second measuring instruments is equal to or less than the predetermined value to determine the number of the second measuring instruments as the second specified number, according to data indicating an error distribution obtained based on the error information regarding the errors possessed by the second measuring instruments.

5. A power system comprising:
an aggregator that controls a supply-and-demand balance of the power system including a power grid and a plurality of vehicles each having a battery; and
a power calculation apparatus communicable with the aggregator, the power calculation apparatus comprising:
a microprocessor and a memory connected to the microprocessor, wherein the microprocessor is configured to perform:
acquiring power amount information regarding amounts of power input to and output from the plurality of vehicles, the amounts of power detected by a plurality of measuring instruments;
classifying, based on error information regarding errors possessed by the plurality of measuring instruments, the measuring instruments into a plurality of measuring instrument groups each including at least a specified number of measuring instruments, the errors being measured in advance, the specified number determined such that a mean value of relative value of errors of the amounts of power detected by the measuring instruments belonging to a same measuring instrument group is a predetermined value or less; and calculating a total power input and output in each of the measuring instrument groups, based on the power amount information regarding the amounts of power detected by at least the specified number of measuring instruments belonging to each of the measuring instrument groups, and transmitting information indicating the total power to the aggregator, wherein the aggregator adjusts the supply-and-demand balance of the power system based on the total power by transmitting a command to the vehicles of one or more of the measuring instrument groups causing the battery mounted on each of the vehicles to discharge to the power grid, wherein the plurality of measuring instruments is a plurality of first measuring instruments provided in the plurality of vehicles or a plurality of second measuring instruments provided in a plurality of connection equipment interposed between a power grid and the plurality of vehicles, the microprocessor is configured to perform
the classifying including varying the specified number between a case where the plurality of measuring instruments is the plurality of first measuring instruments and a case where the plurality of measuring instruments is the plurality of second measuring instruments, and the specified number in the case where the plurality of measuring instruments is the plurality of first measuring instruments is larger than the specified number in the case where the plurality of measuring instruments is the plurality of second measuring instrument, the memory is configured to store the error information regarding the errors possessed by the first measuring instruments, and the microprocessor is configured to perform the classifying including searching a number of the first measuring instruments such that the mean value of errors of the amounts of power detected by the first measuring instruments is equal to or less than the specified value to determine the number of the first measuring instruments as the first specified number, according to data indicating an error distribution obtained based on the error information regarding the errors possessed by the first measuring instruments stored in the memory, and determining the second specified number such that the second specified number is less than the first specified number.

* * * * *